US010186318B1

(12) United States Patent
Yang et al.

(10) Patent No.: US 10,186,318 B1
(45) Date of Patent: Jan. 22, 2019

(54) SENSE AMPLIFIER OF RESISTIVE MEMORY AND OPERATING METHOD THEREOF

(71) Applicant: NATIONAL TSING HUA UNIVERSITY, Hsinchu (TW)

(72) Inventors: Tzu-Hsien Yang, New Taipei (TW); Meng-Fan Chang, Taichung (TW)

(73) Assignee: NATIONAL TSING HUA UNIVERSITY, Hsinchu (TW)

( * ) Notice: Subject to any disclaimer, the term of this patent is extended or adjusted under 35 U.S.C. 154(b) by 0 days.

(21) Appl. No.: 15/939,262

(22) Filed: Mar. 28, 2018

(51) Int. Cl.
*G11C 11/00* (2006.01)
*G11C 13/00* (2006.01)

(52) U.S. Cl.
CPC .... *G11C 13/004* (2013.01); *G11C 2013/0042* (2013.01); *G11C 2013/0054* (2013.01)

(58) Field of Classification Search
CPC ..... G11C 13/004; G11C 11/1673; G11C 7/18; G11C 7/062; G11C 2211/5634
See application file for complete search history.

(56) References Cited

U.S. PATENT DOCUMENTS

| 7,400,521 B1 * | 7/2008 | Hoenigschmid .... G11C 11/5614 365/100 |
| 9,847,127 B1 * | 12/2017 | Roy .................... G11C 13/0026 |
| 2006/0067138 A1 * | 3/2006 | Ogiwara ................. G11C 11/22 365/189.09 |
| 2012/0087169 A1 * | 4/2012 | Kuo ......................... G11C 7/18 365/72 |
| 2014/0160832 A1 * | 6/2014 | Ito .......................... G11C 7/067 365/148 |
| 2016/0358648 A1 * | 12/2016 | Park ..................... G11C 13/004 |
| 2017/0221538 A1 * | 8/2017 | Kim ..................... G11C 11/1655 |
| 2018/0144797 A1 * | 5/2018 | Kitagawa ........... G11C 13/0026 |

* cited by examiner

*Primary Examiner* — Tuan T Nguyen
(74) *Attorney, Agent, or Firm* — CKC & Partners Co., Ltd.

(57) ABSTRACT

A sense amplifier of a resistive memory is controlled by a bit line and a reference line. A voltage sense amplifier has a bit-line input node and a reference input node. A margin enhanced pre-amplifier includes a bit-line two-terminal switching element, a bit-line capacitor, a bit-line three-terminal switching element, a reference two-terminal switching element, a reference capacitor and a reference three-terminal switching element. A read voltage difference between the voltage level of the bit line and the reference line is generated. The bit-line two-terminal switching element, the bit-line three-terminal switching element, the reference two-terminal switching element and the reference three-terminal switching element are synchronizedly switched so as to generate a margin enhanced difference between the voltage level of the bit-line input node and the voltage level of the reference input node. The margin enhanced difference is equal to or greater than three times the read voltage difference.

20 Claims, 11 Drawing Sheets

Fig. 9A

SENSE AMPLIFIER OF RESISTIVE MEMORY AND OPERATING METHOD THEREOF

BACKGROUND

Technical Field

The present disclosure relates to a sense amplifier of a resistive memory and an operating method thereof. More particularly, the present disclosure relates to a sense amplifier of a resistive memory and an operating method thereof which are capable of enhancing effective sensing margin.

Description of Related Art

In these years, due to the industrial growth of mobile device, medical electrical equipment, portable storage, etc., requirement of memory with low power, high speed and high density is increased. However, sensing margin time of the memory is the key factor which may limit the access time of the memory. It is known to provide memory circuitry including an array of bit cells within which columns of bit cells are connected by bit line pairs. The bit line pairs are precharged to a given voltage and then one of the bit lines of the pair is discharged depending upon the contents of the bit cell within a column that is read. The difference in voltage which arises between the bit lines of the bit line pair as a result of this discharge is sensed by a sense amplifier coupled to the bit lines.

In a long bit-line length resistive memory array, developing time would be a bottleneck in sensing operation since it takes lots of time to accumulate a slow-growing voltage difference between a bit-line voltage and a reference voltage. Decreasing of developing time leads to read failure because the voltage difference between the bit-line voltage and the reference voltage is smaller than an offset voltage from the sense amplifier. Therefore, a sense amplifier of a resistive memory and an operating method thereof having the features of decreasing developing time to improve sensing performance with shorter read access time are commercially desirable.

SUMMARY

According to one aspect of the present disclosure, a sense amplifier of a resistive memory is controlled by a bit line and a reference line. The sense amplifier of the resistive memory includes a voltage sense amplifier and a margin enhanced pre-amplifier. The voltage sense amplifier has a bit-line input node and a reference input node. The margin enhanced pre-amplifier is signally connected to the voltage sense amplifier, and the margin enhanced pre-amplifier includes a bit-line amplifying module and a reference amplifying module. The bit-line amplifying module includes a bit-line two-terminal switching element, a bit-line capacitor and a bit-line three-terminal switching element. The bit-line two-terminal switching element is coupled between the bit-line input node and the bit line. The bit-line capacitor has a first bit-line terminal and a second bit-line terminal. The first bit-line terminal is coupled to the bit-line input node and the bit-line two-terminal switching element. The bit-line three-terminal switching element is coupled to the second bit-line terminal, the bit line and the reference line. The reference amplifying module includes a reference two-terminal switching element, a reference capacitor and a reference three-terminal switching element. The reference two-terminal switching element is coupled between the reference input node and the reference line. The reference capacitor has a first reference terminal and a second reference terminal. The first reference terminal is coupled to the reference input node and the reference two-terminal switching element. The reference three-terminal switching element is coupled to the second reference terminal, the bit line and the reference line. The bit-line three-terminal switching element is switched to connect the second bit-line terminal to the bit line or the reference line, and the reference three-terminal switching element is switched to connect the second reference terminal to the reference line or the bit line.

According to another aspect of the present disclosure, a sense amplifier of a resistive memory is controlled by a bit line and a reference line. The sense amplifier of the resistive memory includes a voltage sense amplifier and a margin enhanced pre-amplifier. The voltage sense amplifier has a bit-line input node and a reference input node. The margin enhanced pre-amplifier is signally connected to the voltage sense amplifier. The margin enhanced pre-amplifier includes a bit-line amplifying module and a reference amplifying module. The bit-line amplifying module includes a bit-line two-terminal switching element, a bit-line capacitor and a bit-line three-terminal switching element. The bit-line capacitor is coupled to the bit-line two-terminal switching element, the bit-line three-terminal switching element and the bit-line input node. The reference amplifying module includes a reference two-terminal switching element, a reference capacitor and a reference three-terminal switching element. The reference capacitor is coupled to the reference two-terminal switching element, the reference three-terminal switching element and the reference input node. A read voltage difference between the voltage level of the bit line and the voltage level of the reference line is generated. The bit-line two-terminal switching element, the bit-line three-terminal switching element, the reference two-terminal switching element and the reference three-terminal switching element are synchronizedly switched so as to generate a margin enhanced difference between the voltage level of the bit-line input node and the voltage level of the reference input node. The margin enhanced difference is equal to or greater than three times the read voltage difference.

According to further another aspect of the present disclosure, an operating method of the sense amplifier of the resistive memory provides a voltage level applying step and a voltage margin enhancing step. The voltage level applying step is for applying a plurality of voltage levels to the bit line, the reference line and a switching signal, respectively. A read voltage difference between the voltage level of the bit line and the voltage level of the reference line is generated. The voltage margin enhancing step is for switching the bit-line two-terminal switching element, the bit-line three-terminal switching element, the reference two-terminal switching element and the reference three-terminal switching element according to the switching signal so as to enlarge a margin enhanced difference between the voltage level of the bit-line input node and the voltage level of the reference input node.

BRIEF DESCRIPTION OF THE DRAWINGS

The present disclosure can be more fully understood by reading the following detailed description of the embodiment, with reference made to the accompanying drawings as follows.

DETAILED DESCRIPTION

Before describing any embodiments in detail, some terms used in the following are described. A voltage level of "1" represents that the voltage is equal to a voltage source VDD. The voltage level of "0" represents that the voltage is equal to a ground voltage. A PMOS transistor and an NMOS transistor represent a P-type MOS transistor and an N-type MOS transistor, respectively. Each transistor has a source, a drain and a gate.

Figure 1:
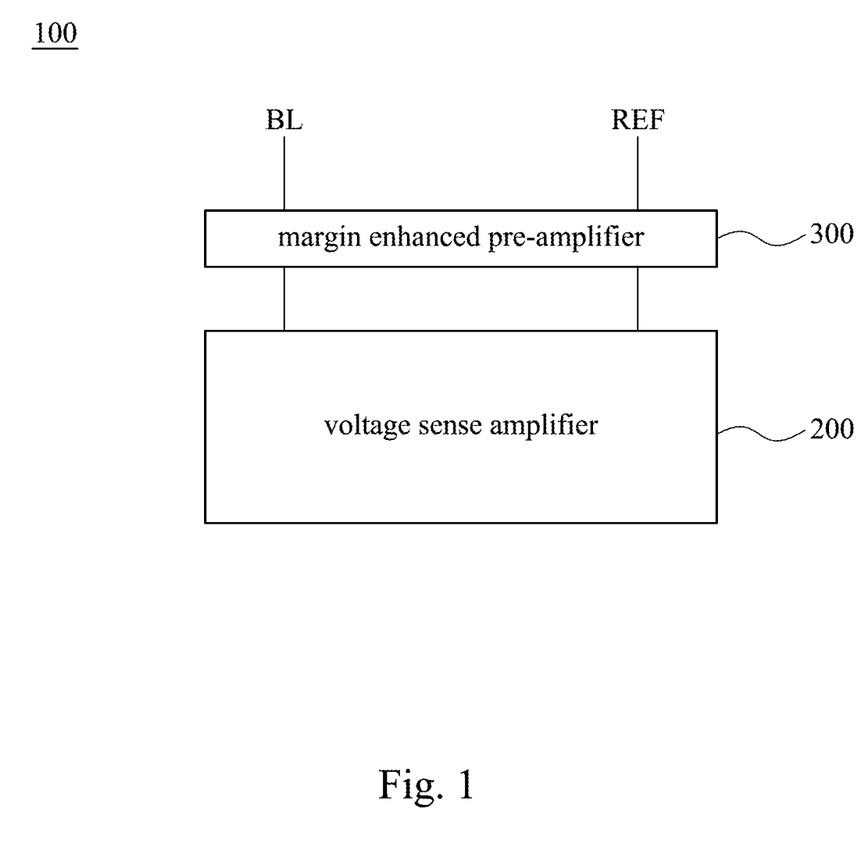
FIG. 1 shows a block diagram of a sense amplifier of a resistive memory according to one embodiment of the present disclosure.
Figure 2:
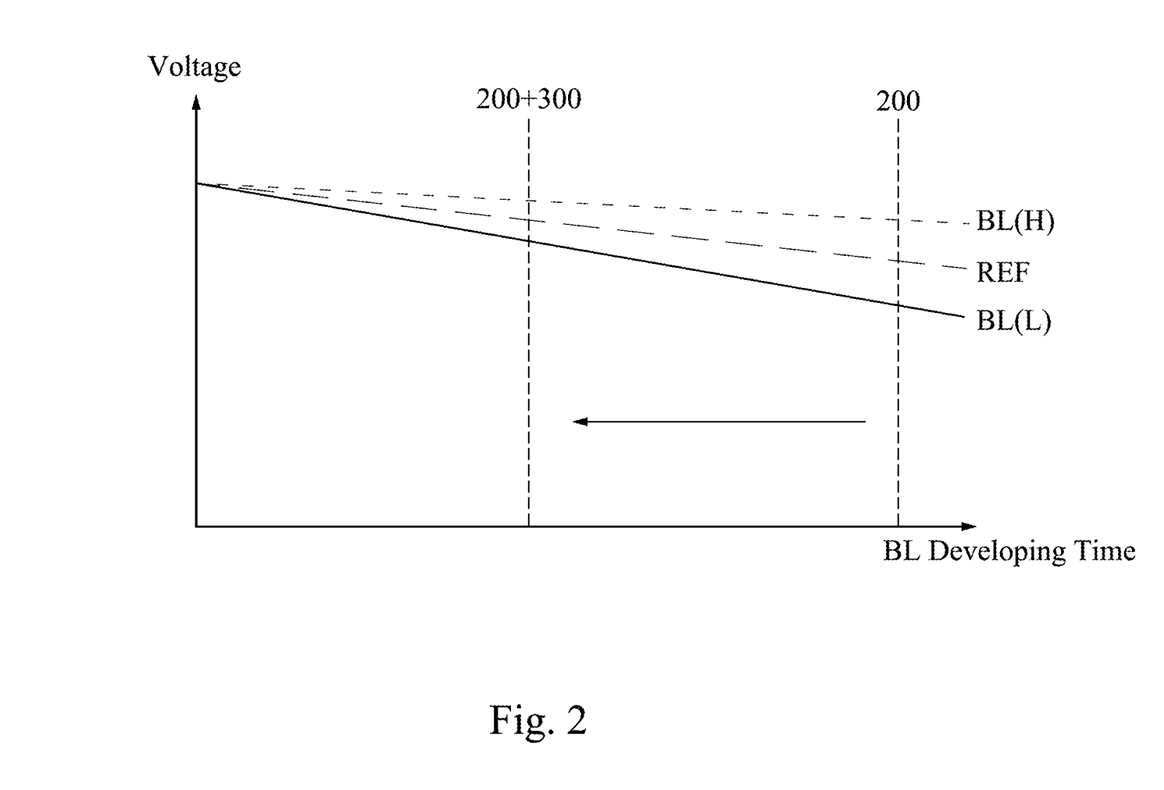
FIG. 2 shows timing diagrams of voltages of a bit line and a reference line of FIG. 1.
Figure 3:
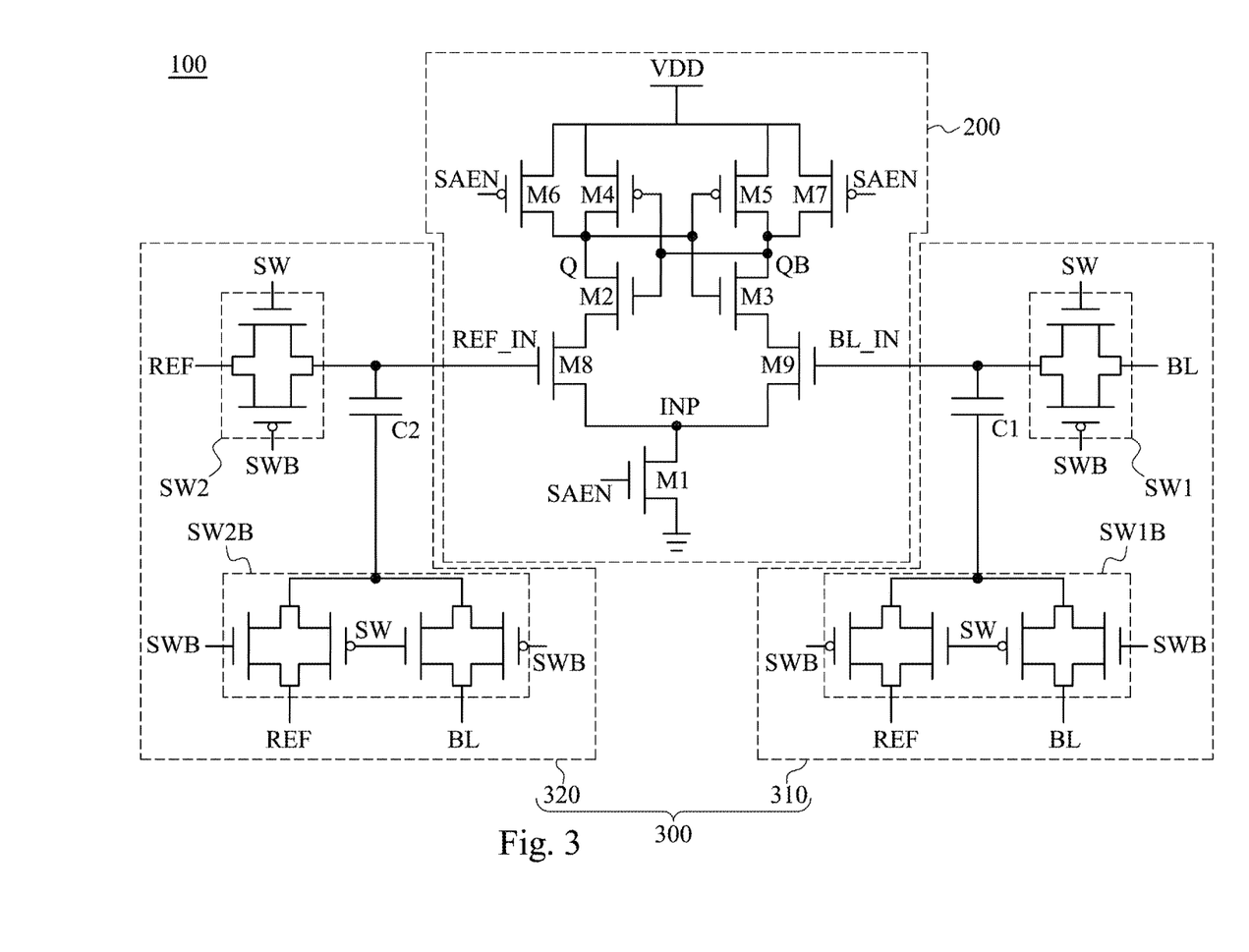
FIG. 3 shows a circuit diagram of the sense amplifier of the resistive memory of FIG. 1.

FIG. 1 shows a block diagram of a sense amplifier 100 of a resistive memory according to one embodiment of the present disclosure; FIG. 2 shows timing diagrams of voltages of a bit line BL and a reference line REF of FIG. 1; and FIG. 3 shows a circuit diagram of the sense amplifier 100 of the resistive memory of FIG. 1. In FIG. 2, the voltages of the bit line BL and the reference line REF are generated under two conditions. One condition is that the voltage level of the bit line BL is greater than the voltage level of the reference line REF (i.e., BL(H)>REF). The other condition is that the voltage level of the bit line BL is smaller than the voltage level of the reference line REF (i.e., BL(L)<REF). In FIGS. 1 and 3, the sense amplifier 100 of the resistive memory is controlled by the bit line BL and the reference line REF. The sense amplifier 100 of the resistive memory includes a voltage sense amplifier 200 and a margin enhanced pre-amplifier 300.

The voltage sense amplifier 200 has a bit-line input node BL_IN, a reference input node REF_IN, an internal node INP, a first output node Q and a second output node QB. The voltage sense amplifier 200 includes a first transistor M1, a second transistor M2, a third transistor M3, a fourth transistor M4, a fifth transistor M5, a sixth transistor M6, a seventh transistor M7, an eighth transistor M8 and a ninth transistor M9. The first transistor M1 is connected between the internal node INP and the ground voltage. The first transistor M1 is an NMOS transistor. The gate of the first transistor M1 is controlled by a SAEN signal. The second transistor M2 is connected to the first output node Q, the second output node QB and the eighth transistor M8. The second transistor M2 is an NMOS transistor. The third transistor M3 is connected to the first output node Q, the second output node QB and the ninth transistor M9. The third transistor M3 is an NMOS transistor. The fourth transistor M4 is connected between the second transistor M2 and the voltage source VDD. The fourth transistor M4 is a PMOS transistor and connected to the first output node Q, the second output node QB and the voltage source VDD. The fifth transistor M5 is connected between the third transistor M3 and the voltage source VDD. The fifth transistor M5 is a PMOS transistor and connected to the first output node Q, the second output node QB and the voltage source VDD. The sixth transistor M6 is connected between the second transistor M2 and the voltage source VDD. The sixth transistor M6 is a PMOS transistor and connected to the first output node Q, the SAEN signal and the voltage source VDD. The seventh transistor M7 is connected between the third transistor M3 and the voltage source VDD. The seventh transistor M7 is a PMOS transistor and connected to the second output node QB, the SAEN signal and the voltage source VDD. The eighth transistor M8 is connected between the second transistor M2 and the first transistor M1. The eighth transistor M8 is an NMOS transistor and connected to the internal node INP and the reference input node REF_IN and the source of the second transistor M2. The ninth transistor M9 is connected between the third transistor M3 and the first transistor M1. The ninth transistor M9 is an NMOS transistor and connected to the internal node INP, the bit-line input node BL_IN and the source of the third transistor M3.

The margin enhanced pre-amplifier 300 is signally connected to the voltage sense amplifier 200, and the margin enhanced pre-amplifier 300 includes a bit-line amplifying module 310 and a reference amplifying module 320. The bit-line amplifying module 310 includes a bit-line two-terminal switching element SW1, a bit-line capacitor C1 and a bit-line three-terminal switching element SW1B. The bit-line two-terminal switching element SW1 is coupled between the bit-line input node BL_IN and the bit line BL. The bit-line capacitor C1 has a first bit-line terminal and a second bit-line terminal, wherein the first bit-line terminal is coupled to the bit-line input node BL_IN and the bit-line two-terminal switching element SW1. The bit-line three-terminal switching element SW1B is coupled to the second bit-line terminal, the bit line BL and the reference line REF. The reference amplifying module 320 includes a reference two-terminal switching element SW2, a reference capacitor C2 and a reference three-terminal switching element SW2B. The reference two-terminal switching element SW2 is coupled between the reference input node REF_IN and the reference line REF. The reference capacitor C2 has a first reference terminal and a second reference terminal, wherein the first reference terminal is coupled to the reference input node REF_IN and the reference two-terminal switching element SW2. The reference three-terminal switching element SW2B is coupled to the second reference terminal, the bit line BL and the reference line REF. The bit-line three-terminal switching element SW1B is switched to connect the second bit-line terminal of the bit-line capacitor C1 to the bit line BL or the reference line REF, and the reference three-terminal switching element SW2B is switched to connect the second reference terminal of the reference capacitor C2 to the reference line REF or the bit line BL.

The bit-line two-terminal switching element SW1 is switched by a switching signal SW. The bit-line two-terminal switching element SW1 can be implemented by one NMOS transistor and one PMOS transistor. The gate of the NMOS transistor of the bit-line two-terminal switching element SW1 is coupled to the switching signal SW, and the gate of the PMOS transistor of the bit-line two-terminal switching element SW1 is coupled to an inverse switching signal SWB. The voltage level of the switching signal SW is opposite to the voltage level of the inverse switching signal SWB, as shown in FIG. 3. When a voltage level of 1 is applied to the switching signal SW, a short circuit in the bit-line two-terminal switching element SW1 is occurred, and the bit-line input node BL_IN is connected to the bit line BL. On the contrary, when a voltage level of 0 is applied to the switching signal SW, the bit-line two-terminal switching element SW1 becomes an open circuit, and the bit-line input node BL_IN is disconnected to the bit line BL. In the embodiment of FIG. 3, the structure of the reference two-terminal switching element SW2 is the same as the structure of the bit-line two-terminal switching element SW1. The reference two-terminal switching element SW2 is switched by the switching signal SW. When a voltage level of 1 is applied to the switching signal SW, a short circuit in the reference two-terminal switching element SW2 is occurred, and the reference input node REF_IN is connected to the reference line REF. On the contrary, when a voltage level of 0 is applied to the switching signal SW, the reference two-terminal switching element SW2 becomes an open circuit, and the reference input node REF_IN is disconnected to the reference line REF.

The bit-line three-terminal switching element SW1B can be implemented by two NMOS transistors and two PMOS transistors. Two gates of the two NMOS transistors of the bit-line three-terminal switching element SW1B are coupled to the switching signal SW and the inverse switching signal SWB, respectively. Two gates of the two PMOS transistors of the bit-line three-terminal switching element SW1B are coupled to the switching signal SW and the inverse switching signal SWB, respectively. When the voltage level of 1 is applied to the switching signal SW, the bit-line three-terminal switching element SW1B is switched to connect the second bit-line terminal of the bit-line capacitor C1 to the reference line REF. When the voltage level of 0 is applied to the switching signal SW, the bit-line three-terminal switching element SW1B is switched to connect the second bit-line terminal of the bit-line capacitor C1 to the bit line BL. In the embodiment of FIG. 3, the structure of the reference three-terminal switching element SW2B is the same as the structure of the bit-line three-terminal switching element SW1B. When the voltage level of 1 is applied to the switching signal SW, the reference three-terminal switching element SW2B is switched to connect the second reference terminal of the reference capacitor C2 to the bit line BL. When the voltage level of 0 is applied to the switching signal SW, the reference three-terminal switching element SW2B is switched to connect the second reference terminal of the reference capacitor C2 to the reference line REF.

Figure 4A:
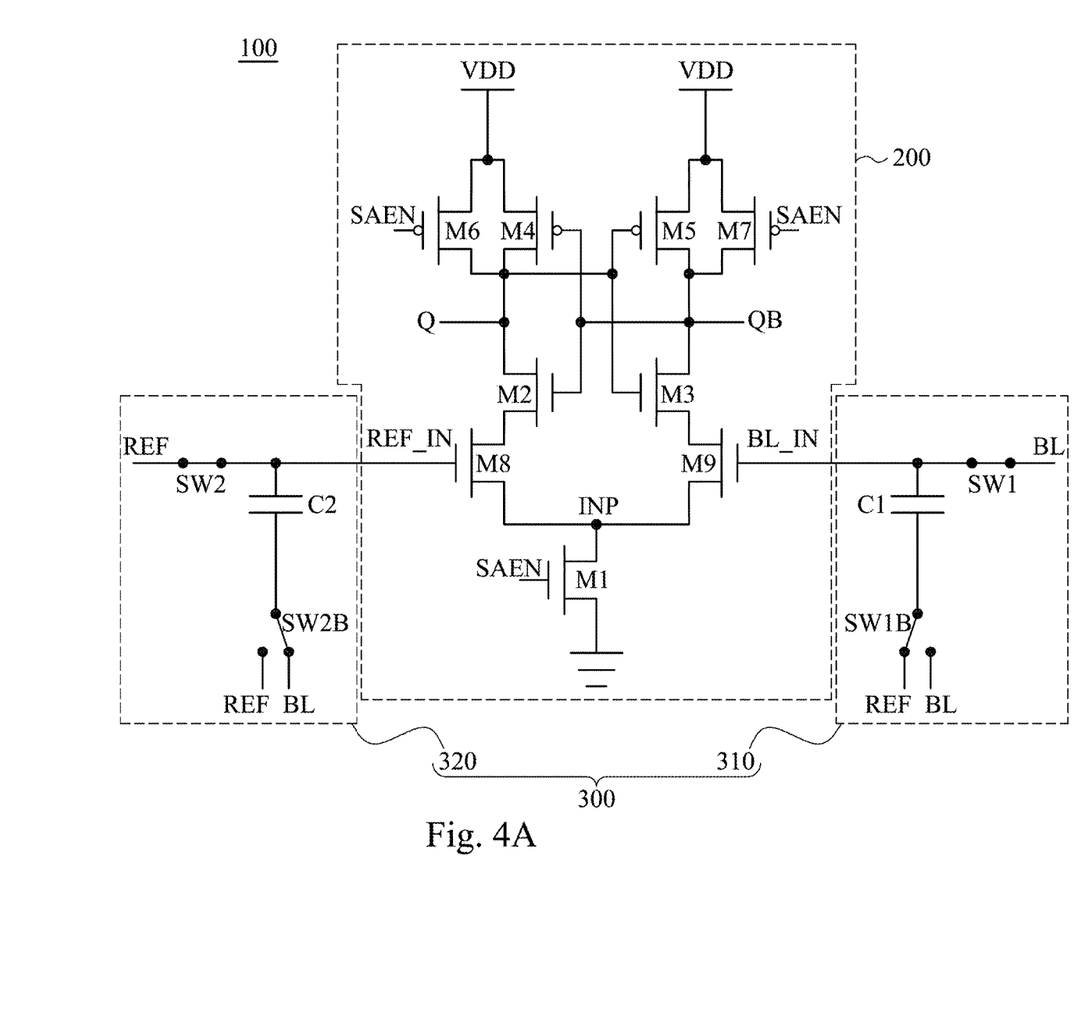
FIG. 4A shows a schematic circuit diagram of the sense amplifier of the resistive memory of FIG. 3, during a first time interval and a second time interval.
Figure 4B:
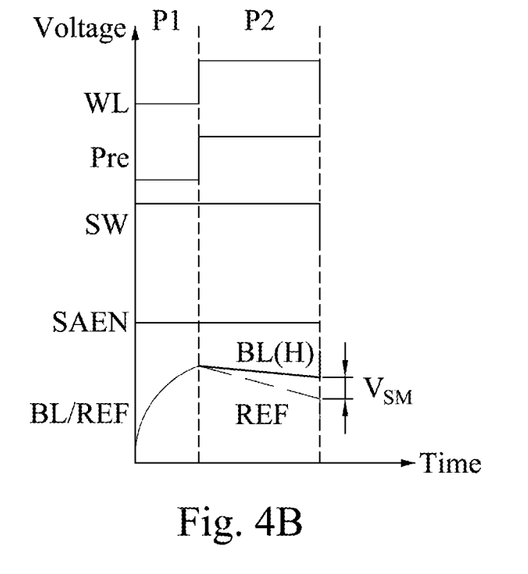
FIG. 4B shows timing diagrams of voltages of a plurality of control signals of FIG. 4A, which is in a high resistance state.
Figure 5A:
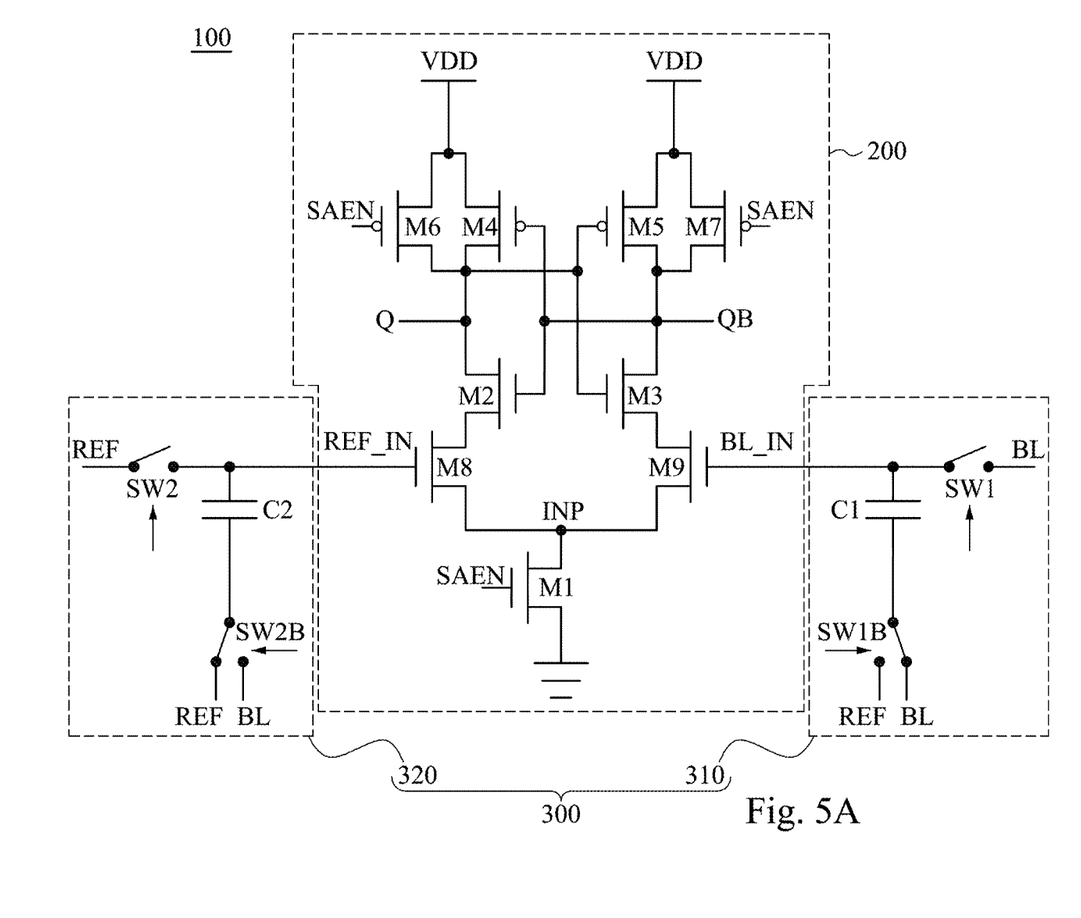
FIG. 5A shows a schematic circuit diagram of the sense amplifier of the resistive memory of FIG. 3, during a third time interval and a fourth time interval.
Figure 5B:
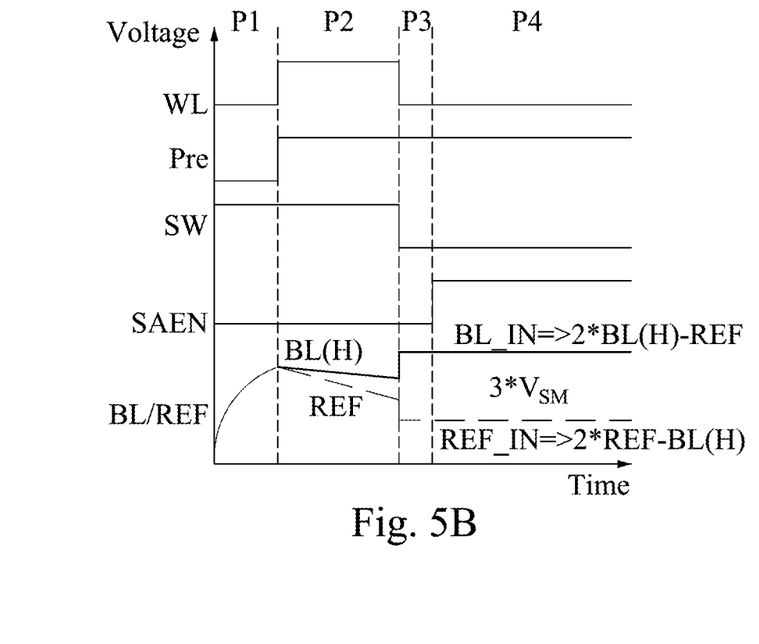
FIG. 5B shows timing diagrams of voltages of the control signals of FIG. 5A, which is in the high resistance state.

FIG. 4A shows a schematic circuit diagram of the sense amplifier 100 of the resistive memory of FIG. 3, during a first time interval P1 and a second time interval P2; FIG. 4B shows timing diagrams of voltages of a plurality of control signals of FIG. 4A, which is in a high resistance state (HRS); FIG. 5A shows a schematic circuit diagram of the sense amplifier 100 of the resistive memory of FIG. 3, during a third time interval P3 and a fourth time interval P4; and FIG. 5B shows timing diagrams of voltages of a plurality of control signals of FIG. 5A, which is in the high resistance state. The control signals include a WL signal (labeled as WL in FIGS. 4B and 5B), a Pre signal (labeled as Pre in FIGS. 4B and 5B), a switching signal SW, a SAEN signal (labeled as SAEN in FIGS. 4B and 5B), a BL_IN signal and a REF_IN signal (labeled as BL/REF in FIGS. 4B and 5B). During the first time interval P1, the voltage levels of the WL signal, the Pre signal, the switching signal SW and the SAEN signal are "0", "0", "1" and "0", respectively. The bit-line input node BL_IN and the reference input node REF_IN are pre-charged to a read voltage Vread which has a voltage magnitude ranging between the voltage source VDD and the ground voltage. During the second time interval P2, the voltage levels of the WL signal, the Pre signal, the switching signal SW and the SAEN signal are "1", "1", "1" and "0", respectively. Pre-charge is finished, and the voltage of the bit line BL starts to fall. When the margin enhanced pre-amplifier 300 is in the high resistance state, the voltage level of the bit line BL is greater than the voltage level of the reference line REF (i.e., BL(H)>REF in FIGS. 4B and 5B), and a read voltage difference $V_{SM}$ between the voltage level of the bit line BL and the voltage level of the reference line REF is generated. During the third time interval P3, the voltage levels of the WL signal, the Pre signal, the switching signal SW and the SAEN signal are "0", "1", "0" and "0", respectively. When the voltage level of the switching signal SW is switched from 1 to 0, a margin enhanced difference between the voltage level of the bit-line input node BL_IN and the voltage level of the reference input node REF_IN is equal to or greater than three times the read voltage difference $V_{SM}$. During the fourth time interval P4, the voltage levels of the WL signal, the Pre signal, the switching signal SW and the SAEN signal are "0", "1", "0" and "1", respectively.

Figure 6:
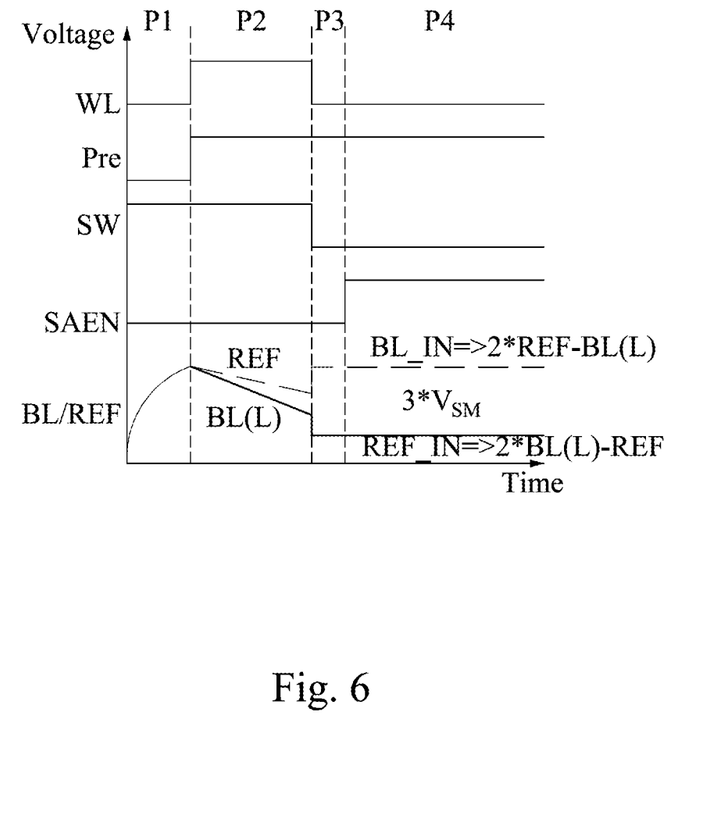
FIG. 6 shows timing diagrams of voltages of the control signals of FIG. 3, from the first time interval to the fourth time interval in a low resistance state.

FIG. 6 shows timing diagrams of voltages of the control signals of FIG. 3, from the first time interval to the fourth time interval in a low resistance state (LRS). When the margin enhanced pre-amplifier 300 is in the low resistance state, a voltage level of the bit line BL is smaller than a voltage level of the reference line REF (i.e., BL(L)<REF in FIG. 6), and a read voltage difference $V_{SM}$ between the voltage level of the bit line BL and the voltage level of the reference line REF is generated. When the voltage level of the switching signal SW is switched from 1 to 0, a margin enhanced difference between the voltage level of the reference input node REF_IN and the voltage level of the bit-line input node BL_IN is equal to or greater than three times the read voltage difference $V_{SM}$. Therefore, the sense amplifier 100 of the resistive memory and the operating method thereof of the present disclosure enhance an effective sensing margin by combining the margin enhanced pre-amplifier 300 with the voltage sense amplifier 200 so as to decrease developing time to improve sensing performance with shorter read access time.

Figure 7:
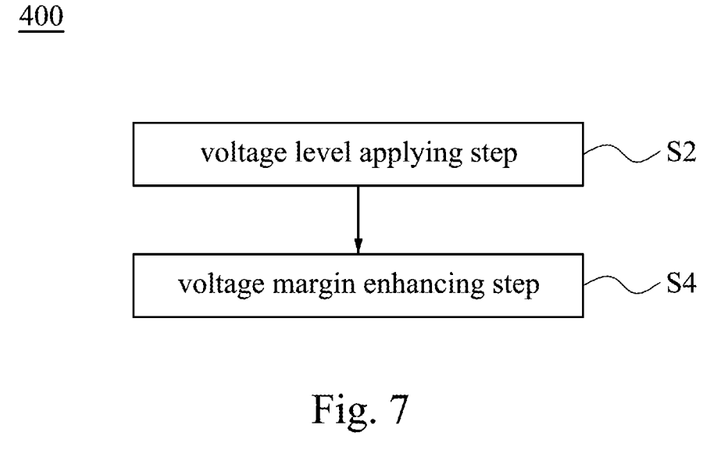
FIG. 7 shows a flow chart of an operating method of a sense amplifier of a resistive memory according to one embodiment of the present disclosure.

FIG. 7 shows a flow chart of an operating method 400 of the sense amplifier 100 of the resistive memory of FIG. 3 according to one embodiment of the present disclosure. The operating method 400 provides a voltage level applying step S2 and a voltage margin enhancing step S4. The voltage level applying step S2 is for applying a plurality of voltage levels to a WL signal, a Pre signal, a switching signal SW, a SAEN signal, a bit line BL and a reference line REF, respectively. A read voltage difference $V_{SM}$ between the voltage level of the bit line BL and the voltage level of the reference line REF is generated. The voltage margin enhancing step S4 is for switching the bit-line two-terminal switching element SW1, the bit-line three-terminal switching element SW1B, the reference two-terminal switching element SW2 and the reference three-terminal switching element SW2B according to the switching signal so as to enlarge a margin enhanced difference between the voltage level of the bit-line input node BL_IN and the voltage level of the reference input node REF_IN. In detail, when the voltage level of 1 is applied to the switching signal SW, a short circuit in the bit-line two-terminal switching element SW1 is occurred. The bit-line input node BL_IN is connected to the bit line BL. The bit-line three-terminal switching element SW1B is switched to connect the second bit-line terminal to the reference line REF. A short circuit in the reference two-terminal switching element SW2 is occurred. The reference input node REF_IN is connected to the reference line REF. The reference three-terminal switching element SW2B is switched to connect the second reference terminal to the bit line BL. In addition, when the voltage level of 0 is applied to the switching signal SW, the bit-line two-terminal switching element SW1 becomes an open circuit, and the bit-line input node BL_IN is disconnected to the bit line BL. The bit-line three-terminal switching element SW1B is switched to connect the second bit-line terminal to the bit line BL. The reference two-terminal switching element SW2 becomes an open circuit. The reference input node REF_IN is disconnected to the reference line REF, and the reference three-terminal switching element SW2B is switched to connect the second reference terminal to the reference line REF.

In one embodiment, in the voltage level applying step S2, the voltage level of the bit line BL is greater than the voltage level of the reference line REF. The voltage level of the bit line BL and the voltage level of the reference line REF are equal to the voltage level of the bit-line input node BL_IN and the reference input node REF_IN, respectively, and the voltage level of the switching signal SW is 1 so as to allow the margin enhanced pre-amplifier 300 to be in a high resistance state, during the first time interval P1 and the second time interval P2. In the voltage margin enhancing step S4, when the margin enhanced pre-amplifier 300 is in the high resistance state, and the voltage level of the switching signal SW is switched from 1 to 0, the margin enhanced difference is equal to or greater than three times the read voltage difference $V_{SM}$ so as to decrease developing time to improve sensing performance with shorter read access time.

In another embodiment, in the voltage level applying step S4, the voltage level of the bit line BL is smaller than the voltage level of the reference line REF. The voltage level of the bit line BL and the voltage level of the reference line REF are equal to the voltage level of the bit-line input node BL_IN and the reference input node REF_IN, respectively, and the voltage level of the switching signal is 1 so as to allow the margin enhanced pre-amplifier to be in a low resistance state, during the first time interval P1 and the second time interval P2. In the voltage margin enhancing step S4, when the margin enhanced pre-amplifier 300 is in the low resistance state, and the voltage level of the switching signal is switched from 1 to 0, the margin enhanced difference is equal to or greater than three times the read voltage difference $V_{SM}$ so as to decrease developing time to improve sensing performance with shorter read access time.

Figure 8A:
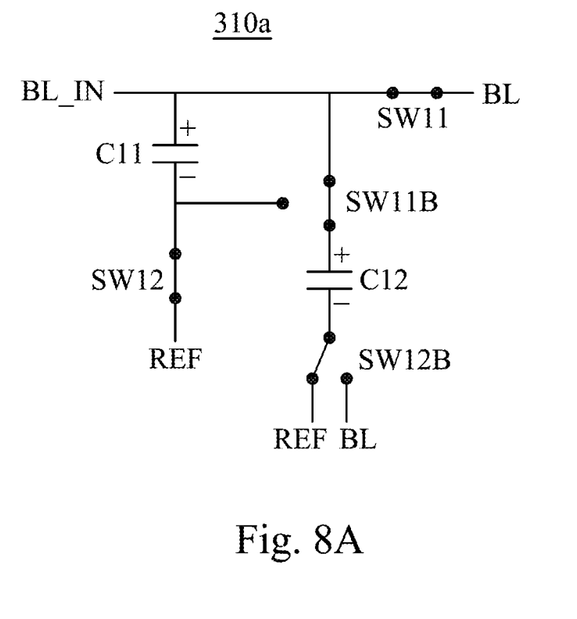
FIG. 8A shows one schematic circuit diagram of a bit-line amplifying module of a sense amplifier of a resistive memory according to another embodiment of the present disclosure, during a first time interval and a second time interval.
Figure 8B:
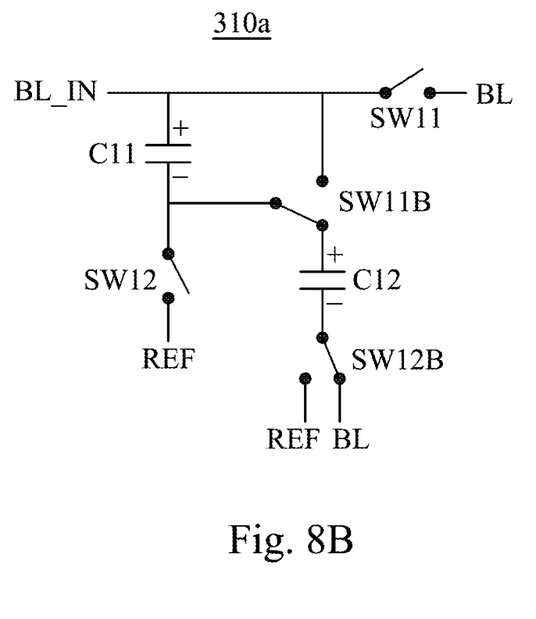
FIG. 8B shows another schematic circuit diagram of the bit-line amplifying module of the sense amplifier of the resistive memory of FIG. 8A, during a third time interval and a fourth time interval.
Figure 9A:
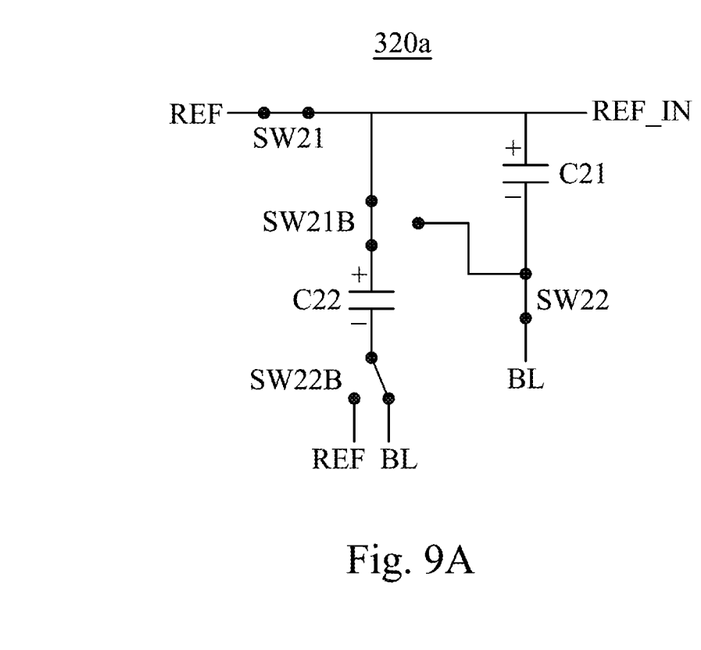
FIG. 9A shows one schematic circuit diagram of a reference amplifying module of a sense amplifier of a resistive memory according to another embodiment of the present disclosure, during the first time interval and the second time interval.
Figure 9B:
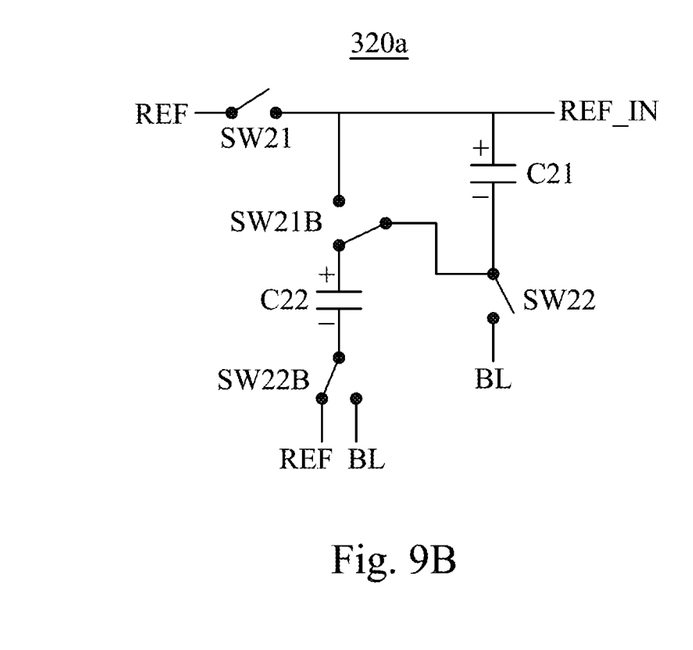
FIG. 9B shows another schematic circuit diagram of the reference amplifying module of the sense amplifier of the resistive memory of FIG. 9A, during the third time interval and the fourth time interval.

FIG. 8A shows one schematic circuit diagram of a bit-line amplifying module 310a of a sense amplifier 100 of a resistive memory according to another embodiment of the present disclosure, during a first time interval P1 and a second time interval P2; FIG. 8B shows another schematic circuit diagram of the bit-line amplifying module 310a of the sense amplifier 100 of the resistive memory of FIG. 8A, during a third time interval P3 and a fourth time interval P4; FIG. 9A shows one schematic circuit diagram of a reference amplifying module 320a of the sense amplifier 100 of the resistive memory according to another embodiment of the present disclosure, during the first time interval P1 and the second time interval P2; and FIG. 9B shows another schematic circuit diagram of the reference amplifying module 320a of the sense amplifier 100 of the resistive memory of FIG. 9A, during the third time interval P3 and the fourth time interval P4. The sense amplifier 100 of the resistive memory is controlled by a bit line BL and a reference line REF, and the sense amplifier 100 includes a voltage sense amplifier 200 and a margin enhanced pre-amplifier 300.

The structure of the voltage sense amplifier 200 is the same as the structure of the voltage sense amplifier 200 of FIG. 3. The margin enhanced pre-amplifier 300 includes a bit-line amplifying module 310a and a reference amplifying module 320a. The bit-line amplifying module 310a includes a first bit-line two-terminal switching element SW11, a second bit-line two-terminal switching element SW12, a first bit-line capacitor C11, a second bit-line capacitor C12, a first bit-line three-terminal switching element SW11B and a second bit-line three-terminal switching element SW12B. The first bit-line two-terminal switching element SW11 is coupled between the bit-line input node BL_IN and the bit line BL. The first bit-line capacitor C11 has a first bit-line positive terminal and a first bit-line negative terminal. The second bit-line capacitor C12 has a second bit-line positive terminal and a second bit-line negative terminal. The first bit-line positive terminal is coupled to the bit-line input node BL_IN and the first bit-line two-terminal switching element SW11. The first bit-line three-terminal switching element SW11B is coupled to the bit-line input node BL_IN, the first bit-line negative terminal and the second bit-line positive terminal. The second bit-line two-terminal switching element SW12 is coupled between the first bit-line negative terminal and the reference line REF. The second bit-line three-terminal switching element SW12B is coupled to the second bit-line negative terminal, the bit line BL and the reference line REF. Moreover, the reference amplifying module 320a includes a first reference two-terminal switching element SW21, a second reference two-terminal switching element SW22, a first reference capacitor C21, a second reference capacitor C22, a first reference three-terminal switching element SW21B and a second reference three-terminal switching element SW22B. The first reference two-terminal switching element SW21 is coupled between the reference input node REF_IN and the reference line REF. The first reference capacitor C11 has a first reference positive terminal and a first reference negative terminal. The second reference capacitor C22 has a second reference positive terminal and a second reference negative terminal. The first reference positive terminal is coupled to the reference input node REF_IN and the first reference two-terminal switching element SW21. The first reference three-terminal switching element SW21B is coupled to the reference input node REF_IN, the first reference negative terminal and the second reference positive terminal. The second reference two-terminal switching element SW22 is coupled between the first reference negative terminal and the bit line BL. The second reference three-terminal switching element SW22B is coupled to the second reference negative terminal, the bit line BL and the reference line REF.

In FIGS. 8A, 8B, 9A and 9B, the first bit-line two-terminal switching element SW11, the second bit-line two-terminal switching element SW12, the first bit-line three-terminal switching element SW11B, the second bit-line three-terminal switching element SW12B, the first reference two-terminal switching element SW21, the second reference two-terminal switching element SW22, the first reference three-terminal switching element SW21B and the second reference three-terminal switching element SW22B are synchronizedly switched by a switching signal SW. A read voltage difference $V_{SM}$ between the voltage level of the bit line BL and the voltage level of the reference line REF is generated. When the voltage level of the switching signal SW is switched from 1 to 0, a margin enhanced difference between the voltage level of the bit-line input node BL_IN and the voltage level of the reference input node REF_IN is equal to or greater than four times the read voltage difference $V_{SM}$ because of charge sharing on a bit-line connecting node between the first bit-line capacitor C11 and the second bit-line capacitor C12, and charge sharing on a reference connecting node between the first reference capacitor C21 and a second reference capacitor C22. Accordingly, the sense amplifier 100 of the resistive memory and the operating method thereof of the present disclosure enhance an effective sensing margin by combining the margin enhanced pre-amplifier 300 with the voltage sense amplifier 200 so as to decrease developing time to improve sensing performance with shorter read access time.

According to the aforementioned embodiments and examples, the advantages of the present disclosure are described as follows.

1. The sense amplifier of the resistive memory and the operating method thereof of the present disclosure enhance an effective sensing margin by combining the margin enhanced pre-amplifier with the voltage sense amplifier so as to decrease developing time to improve sensing performance with shorter read access time.

2. The sense amplifier of the resistive memory and the operating method thereof of the present disclosure are suitable for a long bit-line resistive type memory, e.g. a large capacity ReRAM memory.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A sense amplifier of a resistive memory, which is controlled by a bit line and a reference line, the sense amplifier of the resistive memory comprising:

a voltage sense amplifier having a bit-line input node and a reference input node; and a margin enhanced pre-amplifier signally connected to the voltage sense amplifier, and the margin enhanced pre-amplifier comprising:

a bit-line amplifying module, comprising:

a bit-line two-terminal switching element coupled between the bit-line input node and the bit line;

a bit-line capacitor having a first bit-line terminal and a second bit-line terminal, wherein the first bit-line terminal is coupled to the bit-line input node and the bit-line two-terminal switching element; and a bit-line three-terminal switching element coupled to the second bit-line terminal, the bit line and the reference line; and a reference amplifying module, comprising:

a reference two-terminal switching element coupled between the reference input node and the reference line;

a reference capacitor having a first reference terminal and a second reference terminal, wherein the first reference terminal is coupled to the reference input node and the reference two-terminal switching element; and a reference three-terminal switching element coupled to the second reference terminal, the bit line and the reference line;

wherein the bit-line three-terminal switching element is switched to connect the second bit-line terminal to the bit line or the reference line, and the reference three-terminal switching element is switched to connect the second reference terminal to the reference line or the bit line.

2. The sense amplifier of the resistive memory of claim 1, wherein the voltage sense amplifier has an internal node, a first output node and a second output node, and the voltage sense amplifier comprising:

a first transistor connected between the internal node and a ground voltage;

a second transistor connected to the first output node and the second output node;

a third transistor connected to the first output node and the second output node;

a fourth transistor connected between the second transistor and a voltage source, wherein the fourth transistor is connected to the first output node and the second output node;

a fifth transistor connected between the third transistor and the voltage source, wherein the fifth transistor is connected to the first output node and the second output node;

a sixth transistor connected between the second transistor and the voltage source, wherein the sixth transistor is connected to the first output node;

a seventh transistor connected between the third transistor and the voltage source, wherein the seventh transistor is connected to the second output node;

an eighth transistor connected between the second transistor and the first transistor, wherein the eighth transistor is connected to the internal node and the reference input node; and a ninth transistor connected between the third transistor and the first transistor, wherein the ninth transistor is connected to the internal node and the bit-line input node.

3. The sense amplifier of the resistive memory of claim 1, wherein the bit-line two-terminal switching element is switched by a switching signal;
- when a voltage level of 1 is applied to the switching signal, a short circuit in the bit-line two-terminal switching element is occurred, and the bit-line input node is connected to the bit line; and
- when a voltage level of 0 is applied to the switching signal, the bit-line two-terminal switching element becomes an open circuit, and the bit-line input node is disconnected to the bit line.

4. The sense amplifier of the resistive memory of claim 3, wherein,
- when the voltage level of 1 is applied to the switching signal, the bit-line three-terminal switching element is switched to connect the second bit-line terminal to the reference line; and
- when the voltage level of 0 is applied to the switching signal, the bit-line three-terminal switching element is switched to connect the second bit-line terminal to the bit line.

5. The sense amplifier of the resistive memory of claim 3, wherein,
- when the margin enhanced pre-amplifier is in a high resistance state, a voltage level of the bit line is greater than a voltage level of the reference line, and a read voltage difference between the voltage level of the bit line and the voltage level of the reference line is generated; and
- when the voltage level of the switching signal is switched from 1 to 0, a margin enhanced difference between the voltage level of the bit-line input node and the voltage level of the reference input node is equal to or greater than three times the read voltage difference.

6. The sense amplifier of the resistive memory of claim 3, wherein,
- when the margin enhanced pre-amplifier is in a low resistance state, a voltage level of the bit line is smaller than a voltage level of the reference line, and a read voltage difference between the voltage level of the bit line and the voltage level of the reference line is generated; and
- when the voltage level of the switching signal is switched from 1 to 0, a margin enhanced difference between the voltage level of the reference input node and the voltage level of the bit-line input node is equal to or greater than three times the read voltage difference.

7. The sense amplifier of the resistive memory of claim 1, wherein the reference two-terminal switching element is switched by a switching signal;
- when a voltage level of 1 is applied to the switching signal, a short circuit in the reference two-terminal switching element is occurred, and the reference input node is connected to the reference line; and
- when a voltage level of 0 is applied to the switching signal, the reference two-terminal switching element becomes an open circuit, and the reference input node is disconnected to the reference line.

8. The sense amplifier of the resistive memory of claim 7, wherein,
- when the voltage level of 1 is applied to the switching signal, the reference three-terminal switching element is switched to connect the second reference terminal to the bit line; and
- when the voltage level of 0 is applied to the switching signal, the reference three-terminal switching element is switched to connect the second reference terminal to the reference line.

9. An operating method of the sense amplifier of the resistive memory of claim 1, comprising:
- providing a voltage level applying step, wherein the voltage level applying step is for applying a plurality of voltage levels to the bit line, the reference line and a switching signal, respectively, and a read voltage difference between the voltage level of the bit line and the voltage level of the reference line is generated; and
- providing a voltage margin enhancing step, wherein the voltage margin enhancing step is for switching the bit-line two-terminal switching element, the bit-line three-terminal switching element, the reference two-terminal switching element and the reference three-terminal switching element according to the switching signal so as to enlarge a margin enhanced difference between the voltage level of the bit-line input node and the voltage level of the reference input node.

10. The operating method of claim 9, wherein,
- in the voltage level applying step, the voltage level of the bit line is greater than the voltage level of the reference line, the voltage level of the bit line and the voltage level of the reference line are equal to the voltage level of the bit-line input node and the reference input node, respectively, and the voltage level of the switching signal is 1 so as to allow the margin enhanced pre-amplifier to be in a high resistance state; and
- in the voltage margin enhancing step, when the margin enhanced pre-amplifier is in the high resistance state, and the voltage level of the switching signal is switched from 1 to 0, the margin enhanced difference is equal to or greater than three times the read voltage difference.

11. The operating method of claim 9, wherein,
- in the voltage level applying step, the voltage level of the bit line is smaller than the voltage level of the reference line, the voltage level of the bit line and the voltage level of the reference line are equal to the voltage level of the bit-line input node and the reference input node, respectively, and the voltage level of the switching signal is 1 so as to allow the margin enhanced pre-amplifier to be in a low resistance state; and
- in the voltage margin enhancing step, when the margin enhanced pre-amplifier is in the low resistance state, and the voltage level of the switching signal is switched from 1 to 0, the margin enhanced difference is equal to or greater than three times the read voltage difference.

12. The operating method of claim 9, wherein in the voltage margin enhancing step,
- when the voltage level of 1 is applied to the switching signal, a short circuit in the bit-line two-terminal switching element is occurred, the bit-line input node is connected to the bit line, the bit-line three-terminal switching element is switched to connect the second bit-line terminal to the reference line, a short circuit in the reference two-terminal switching element is occurred, the reference input node is connected to the reference line, and the reference three-terminal switching element is switched to connect the second reference terminal to the bit line; and
- when the voltage level of 0 is applied to the switching signal, the bit-line two-terminal switching element becomes an open circuit, the bit-line input node is disconnected to the bit line, the bit-line three-terminal switching element is switched to connect the second bit-line terminal to the bit line, the reference two-terminal switching element becomes an open circuit, the reference input node is disconnected to the reference line, and the reference three-terminal switching element is switched to connect the second reference terminal to the reference line.

13. A sense amplifier of a resistive memory, which is controlled by a bit line and a reference line, the sense amplifier of the resistive memory comprising:
    a voltage sense amplifier having a bit-line input node and a reference input node; and
    a margin enhanced pre-amplifier signally connected to the voltage sense amplifier, and the margin enhanced pre-amplifier comprising:
        a bit-line amplifying module comprising a bit-line two-terminal switching element, a bit-line capacitor and a bit-line three-terminal switching element, wherein the bit-line capacitor is coupled to the bit-line two-terminal switching element, the bit-line three-terminal switching element and the bit-line input node; and
        a reference amplifying module comprising a reference two-terminal switching element, a reference capacitor and a reference three-terminal switching element, wherein the reference capacitor is coupled to the reference two-terminal switching element, the reference three-terminal switching element and the reference input node;
    wherein a read voltage difference between the voltage level of the bit line and the voltage level of the reference line is generated, the bit-line two-terminal switching element, the bit-line three-terminal switching element, the reference two-terminal switching element and the reference three-terminal switching element are synchronizedly switched so as to generate a margin enhanced difference between the voltage level of the bit-line input node and the voltage level of the reference input node, and the margin enhanced difference is equal to or greater than three times the read voltage difference.

14. The sense amplifier of the resistive memory of claim 13, wherein the voltage sense amplifier has an internal node, a first output node and a second output node, and the voltage sense amplifier comprising:
    a first transistor connected between the internal node and a ground voltage;
    a second transistor connected to the first output node and the second output node;
    a third transistor connected to the first output node and the second output node;
    a fourth transistor connected between the second transistor and a voltage source, wherein the fourth transistor is connected to the first output node and the second output node;
    a fifth transistor connected between the third transistor and the voltage source, wherein the fifth transistor is connected to the first output node and the second output node;
    a sixth transistor connected between the second transistor and the voltage source, wherein the sixth transistor is connected to the first output node;
    a seventh transistor connected between the third transistor and the voltage source, wherein the seventh transistor is connected to the second output node;
    an eighth transistor connected between the second transistor and the first transistor, wherein the eighth transistor is connected to the internal node and the reference input node; and
    a ninth transistor connected between the third transistor and the first transistor, wherein the ninth transistor is connected to the internal node and the bit-line input node.

15. The sense amplifier of the resistive memory of claim 13, wherein the bit-line two-terminal switching element is switched by a switching signal;
    when a voltage level of 1 is applied to the switching signal, a short circuit in the bit-line two-terminal switching element is occurred, and the bit-line input node is connected to the bit line; and
    when a voltage level of 0 is applied to the switching signal, the bit-line two-terminal switching element becomes an open circuit, and the bit-line input node is disconnected to the bit line.

16. The sense amplifier of the resistive memory of claim 15, wherein,
    when the voltage level of 1 is applied to the switching signal, the bit-line three-terminal switching element is switched to connect the second bit-line terminal to the reference line; and
    when the voltage level of 0 is applied to the switching signal, the bit-line three-terminal switching element is switched to connect the second bit-line terminal to the bit line.

17. The sense amplifier of the resistive memory of claim 13, wherein the reference two-terminal switching element is switched by a switching signal;
    when a voltage level of 1 is applied to the switching signal, a short circuit in the reference two-terminal switching element is occurred, and the reference input node is connected to the reference line; and
    when a voltage level of 0 is applied to the switching signal, the reference two-terminal switching element becomes an open circuit, and the reference input node is disconnected to the reference line.

18. The sense amplifier of the resistive memory of claim 17, wherein,
    when the voltage level of 1 is applied to the switching signal, the reference three-terminal switching element is switched to connect the second reference terminal to the bit line; and
    when the voltage level of 0 is applied to the switching signal, the reference three-terminal switching element is switched to connect the second reference terminal to the reference line.

19. The sense amplifier of the resistive memory of claim 13, wherein,
    when the margin enhanced pre-amplifier is in a high resistance state, a voltage level of the bit line is greater than a voltage level of the reference line; and
    when the voltage level of the switching signal is switched from 1 to 0, the voltage level of the bit-line input node is greater than the voltage level of the reference input node.

20. The sense amplifier of the resistive memory of claim 13, wherein,
    when the margin enhanced pre-amplifier is in a low resistance state, a voltage level of the bit line is smaller than a voltage level of the reference line; and when the voltage level of the switching signal is switched from 1 to 0, the voltage level of the bit-line input node is smaller than the voltage level of the reference input node.

\* \* \* \* \*